United States Patent [19]
Cox et al.

[11] Patent Number: 5,777,873
[45] Date of Patent: Jul. 7, 1998

[54] AUTOMATED TEST FIXTURE CONTROL SYSTEM

[75] Inventors: John Cox, Durham; Waite R. Warren, Jr., Raleigh, both of N.C.

[73] Assignee: Mitsubishi Semiconductor America, Inc., Durham, N.C.

[21] Appl. No.: 639,817

[22] Filed: Apr. 29, 1996

[51] Int. Cl.[6] .................................................. G01R 31/00
[52] U.S. Cl. .......................... 364/184; 364/552; 364/550; 364/481; 324/158.1; 324/73.1; 324/755; 324/750; 209/573; 209/552
[58] Field of Search ......................... 364/184, 481, 364/579, 580, 268.5, 550, 551.01, 552; 324/73.1, 537, 750, 755, 756, 765, 158.1, 210, 211; 209/509, 552, 562, 563, 564, 567, 568, 571, 573, 3.1, 12.1, 44.1, 606, 630, 263, 912; 365/200, 201, 244; 371/21.1

[56] References Cited

U.S. PATENT DOCUMENTS

| | | | |
|---|---|---|---|
| 4,191,996 | 3/1980 | Chesley | 395/183.06 |
| 4,630,224 | 12/1986 | Sollman | 364/550 |
| 4,709,366 | 11/1987 | Scott et al. | 395/183.22 |
| 5,185,720 | 2/1993 | Vaillancourt et al. | 365/189.02 |
| 5,267,395 | 12/1993 | Jones, Jr. et al. | 29/829 |
| 5,311,119 | 5/1994 | Bullock et al. | 324/756 |
| 5,319,353 | 6/1994 | Ohnishi et al. | 340/525 |
| 5,327,435 | 7/1994 | Warchol | 395/183.12 |
| 5,343,478 | 8/1994 | James et al. | 371/22.31 |
| 5,359,547 | 10/1994 | Cummins et al. | 364/580 |
| 5,396,170 | 3/1995 | D'Souza et al. | 324/158.1 |
| 5,423,050 | 6/1995 | Taylor et al. | 395/183.07 |
| 5,440,231 | 8/1995 | Sugai | 324/158.1 |
| 5,444,387 | 8/1995 | Van Loan et al. | 324/754 |
| 5,459,396 | 10/1995 | Asar | 324/158.1 |
| 5,538,141 | 7/1996 | Gross, Jr. et al. | 209/571 |
| 5,541,504 | 7/1996 | Kubo et al. | 324/158.1 |
| 5,581,491 | 12/1996 | Biwer et al. | 364/580 |
| 5,589,765 | 12/1996 | Ohmart et al. | 324/158.1 |
| 5,598,096 | 1/1997 | Pham et al. | 324/158.1 |
| 5,603,412 | 2/1997 | Gross, Jr. et al. | 209/571 |
| 5,606,262 | 2/1997 | Montalbano et al. | 324/758 |

*Primary Examiner*—Emanuel T. Voeltz
*Assistant Examiner*—Tuan Q. Dam
*Attorney, Agent, or Firm*—Lowe, Price, LeBlanc & Becker

[57] ABSTRACT

In a test system, test fixtures that hold modules are controlled to enable an operator to separate modules that pass a test from modules that fail. When a module under test is properly loaded in a test fixture, a test fixture controller instructs a tester to start a test procedure. For a semiautomatic test fixture, a test start command is automatically supplied to the tester when the test fixture is closed around the module under test. The test fixture controller automatically interprets the test results provided by the tester. The module that passes the test is automatically released from the test fixture. If the module fails, the test fixture controller keeps it locked in the test fixture. The module is released only when an operator presses a failure acknowledgement button on a control box.

36 Claims, 4 Drawing Sheets

AUTOMATED TEST FIXTURE CONTROL SYSTEM

TECHNICAL FIELD

The present invention relates generally to electronic test equipment, and more particularly, to an automated system for controlling test fixtures that hold electronic modules to be tested.

BACKGROUND ART

Automated systems for testing various electronic modules or devices typically employ computers interfaced with digitally controlled stimulus and measurement instrumentation. A flexible automated testing system usually consists of off-the-shelf test instruments joined by a standard bus to relieve the incompatibility problem that can occur in linking parts from different vendors. A major advantage of this approach is that a system can easily be reconfigured for a variety of test applications by swapping one instrument for another.

Automated testing systems are generally fully programmable for applications in which testing is to be done. Nonetheless, they allow for manual operation and operator intervention, for example, to install or remove a device under test.

FIG. 1 shows a simplified exemplary block diagram of an automated testing system capable of carrying out various performance tests on electronic modules. This system comprises a test fixture 2 that holds a module under test (MUT) 4, and enables a user to insert and remove the MUT 4 to and from the test fixture. An example of the test fixture is shown in U.S. Pat. No. 5,459,396 which discloses a fixture for holding a printed circuit board (PCB) under test. The test fixture comprises air-operated solenoids disposed in spaced-apart relationship that have an extendible arm to securely fix the PCB.

The test fixture 2 is coupled to a tester 6 controlled by a personal computer 8 to perform testing procedures. The tester 6 comprises a stimulus generator 62 that supplies the MUT 4 with input test signals. For example, the stimulus generator 62 may include combinational logic circuits that generate various logic combinations to test logic circuits of the MUT 4. Also, the tester 6 comprises a response measurement device 64 that measures the output values of the MUT 4 produced in response to the input test signals. A computer interface card 66 interfaces the stimulus generator 62 and the response measurement device 64 to the computer 8, which may be either external or internal with respect to the tester 6. The computer 8 is programmed to execute test procedures required to test the MUT 4, and enables an operator to accomplish test control functions, such as selection of test types and adjustment of test inputs. After the test results are displayed on the screen of the computer 8, the tested modules are removed from the test fixture 2, and the operator separates the modules that pass the test from the modules that fail.

However, the conventional test procedure may result in mixing passed and failed modules due to an operator's error. It would be desirable to provide a test control system that enables an operator to separate modules that pass a test from modules that fail so as to prevent their mixing.

Further, in the conventional test procedures that require operator intervention, a test start command is provided manually. It would be desirable to provide a test control system that automatically supplies a tester with a test start command when a module under test is properly loaded, to reduce the time required for testing the module.

DISCLOSURE OF THE INVENTION

Accordingly, one advantage of the invention is in providing a test control system that enables an operator to separate modules that fail a test from modules that pass so as to prevent their mixing.

Another advantage of the invention is in providing a test control system that allows the time required for testing a module to be reduced.

The above and other advantages of the invention are achieved, at least in part, by providing a test system comprising at least one test fixture that locks a module tested using a tester that carries out a prescribed test. For example, a memory module may be tested. A test fixture controller automatically releases the module that passes the test from the test fixture. However, the module that fails the test is kept locked in the test fixture.

Preferably, the test fixture controller keeps the failed module locked in the text fixture until an operator acknowledges a failure.

The test fixture controller that comprises a single board computer may communicate with the tester via a General Purpose Interface Bus (GPIB).

In accordance with one aspect of the invention, the test fixture controller monitors the test fixture to determine when the test fixture is put on-line, and to detect the module under test. In an automatic mode of operation, when the test fixture is properly closed around the module, the test fixture controller automatically supplies the tester with a ready signal to start testing the module. In a manual mode of operation, the test fixture controller supplies the tester with the ready signal when an operator gives a test start command. The tester monitors the test fixture controller to detect the ready signal, and carries out the test procedure in response to this signal. The test fixture controller monitors the tester to detect a binning signal supplied to the test fixture to indicate whether the module passes or fails the test. When the binning signal indicates that the module passes the test, the test fixture controller automatically release the module from the test fixture. When the binning signal indicates that the module fails the test, the test fixture controller keeps the test fixture closed to prevent the module from being released. The failed module is released from the test fixture when an operator acknowledges that the module fails the test.

In accordance with another aspect of the invention, the test fixture controller may control a plurality of test fixtures independently. When one of the modules is put off-line, the test fixture controller continues its operations with the test fixtures that remain on-line.

In accordance with the method of the present invention the following steps are carried out:

locking an electronic module in the test fixture to test the module, determining whether the module passes or fails a test, automatically releasing the module from the test fixture if the module passes the test, and keeping the module locked in the test fixture if the module fails the test.

Still other objects and advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BEST MODE FOR CARRYING OUT THE INVENTION

Although the invention has general applicability in the field of test equipment, the best mode for practicing the invention is based in part on the realization of an automated system for testing memory modules inserted into a manual or semiautomatic test fixture.

Figure 1:
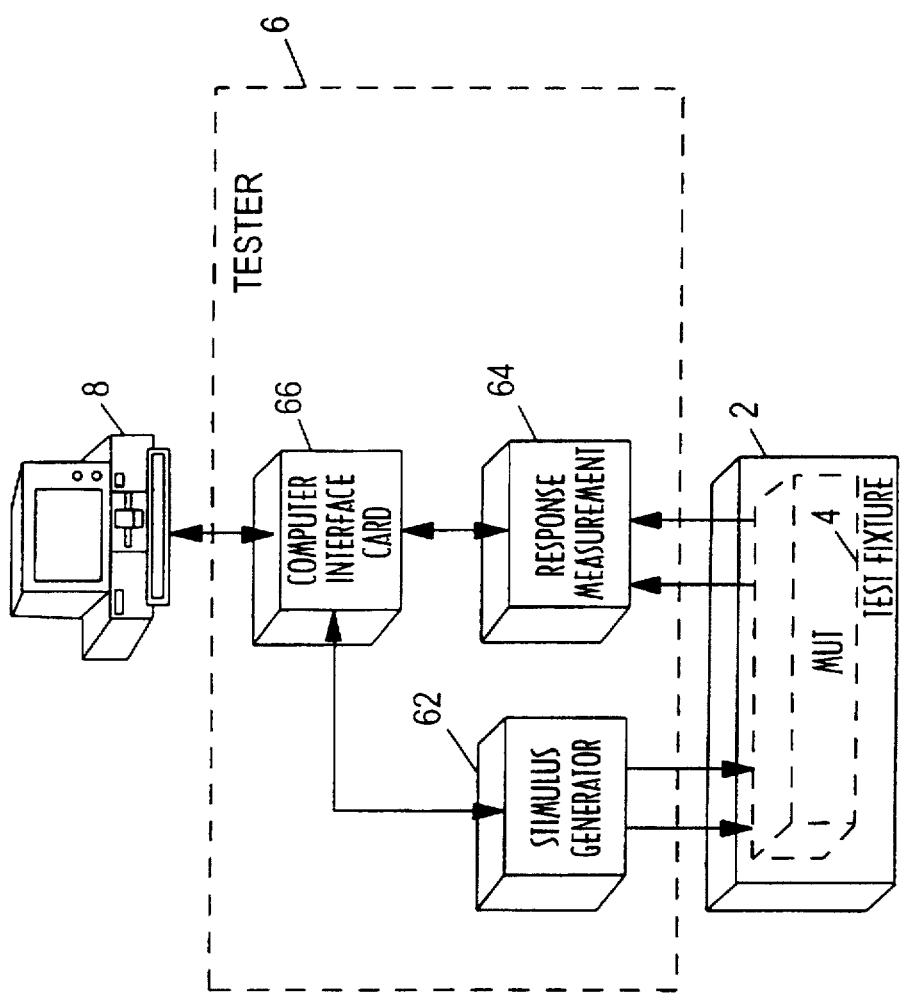
FIG. 1 is a simplified block diagram of a conventional automated testing system.
Figure 2:
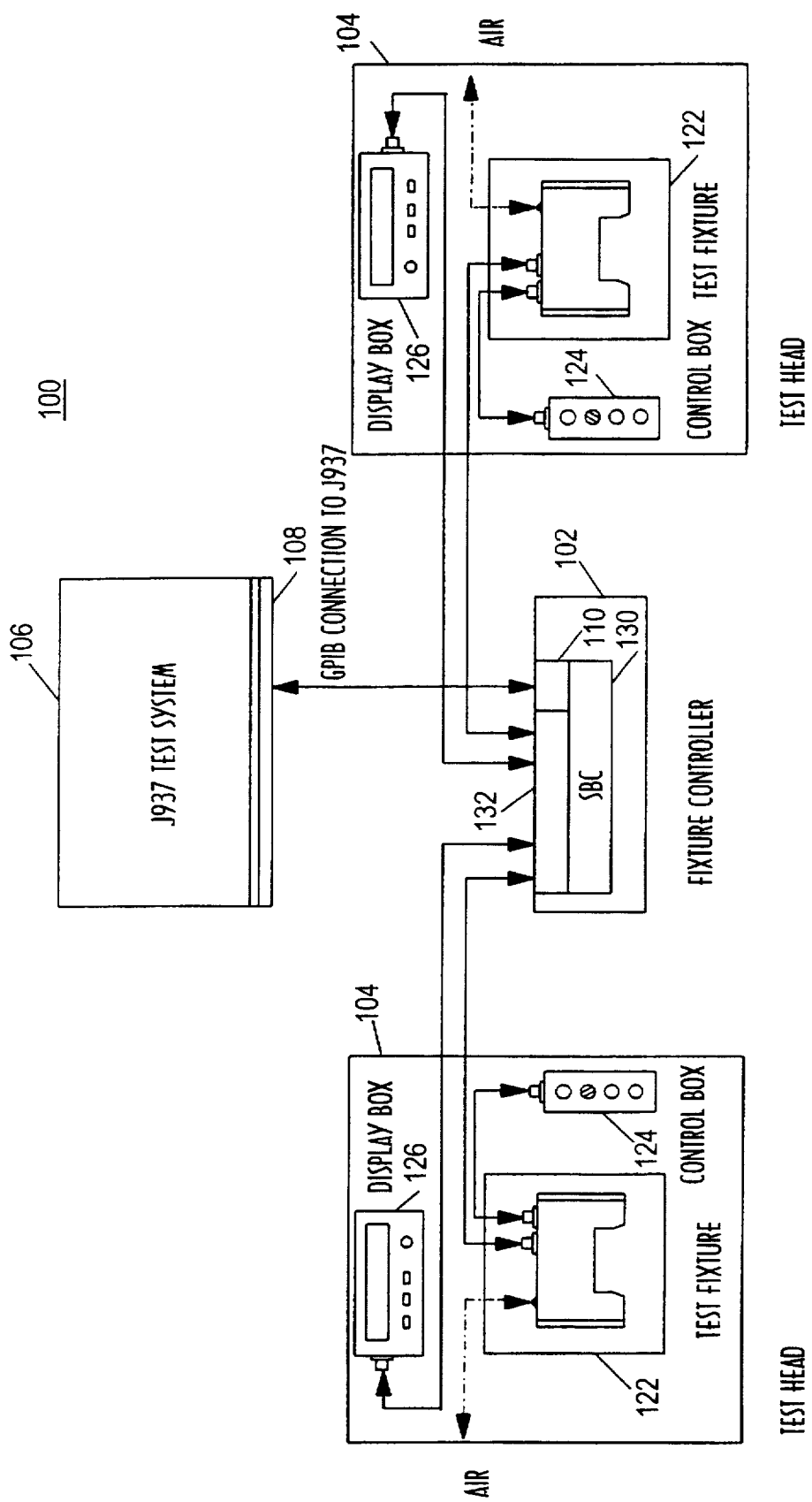
FIG. 2 is a block diagram of an automated test fixture control system of the present invention.

Referring to FIG. 2, an automated test fixture control system 100 of the present invention comprises a test fixture controller 102 coupled to test heads 104, and to a tester 106, for example a J937 tester manufactured by Teradyne, Inc., that is capable of carrying out various performance tests on memory modules installed in the test heads 104. The J937 tester may check such parameters of memory modules as the timing and speed of their read/write functions, and provide validation of the read/write functions. In addition, the J937 tester may run a scan test of memory arrays, and carry out other test procedures. The J937 tester comprises an embedded SUN computer manufactured by Sun Microsystems, Inc. Its system software written in C includes programs that run various test procedures.

The test fixture controller 102 communicates with the tester 106 through a General Purpose Interface Bus (GPIB) defined by the IEEE-488 standard. The GPIB has 16 bidirectional lines coupled between a GPIB card 108 in the tester 106 and a GPIB card 110 in the test fixture controller 102. The GPIB cards 108 and 110, for example manufactured by National Instruments, Inc., run separate communication tasks to provide interaction between the tester 106 and the test fixture controller 102 discussed in more detail later.

The GPIB bus contains eight lines reserved for control signals, five of which provide interface management. Eight lines are dedicated to data signals. To make more efficient use of the bus, communications over the GPIB takes place in packets called message units. A message unit represents a burst of information that has a defined beginning and end.

The IEEE-488 standard defines ten commands called interface functions and used for GPIB control and communications. For example, the Talker (T) command instructs a GPIB device to send data, and the Listener (L) command allows a GPIB device to receive data. The Source Handshake (SH) function synchronizes message transmission, and the Acceptor Handshake (AH) function synchronizes message reception. The Remote Local (RL) function allows a GPIB device to select between GPIB interface and front-panel programming. The Device Clear (DC) function puts a GPIB device in a known state. To program a GPIB device for a specific function or situation, high-level instructions written in C may be used. An overview of the IEEE-488 standard is given in Electronic Test Equipment by T. J. Byers, Section 8, published by Intertext Publications, Inc., McGraw-Hill Book Company, 1987.

Although the block-diagram in FIG. 2 shows a dual test head structure including two test heads 104, the control system 100 of the present invention may operate with a single test head 104 as well as with multiple test heads 104. Each of the test heads 104 comprises a manual or semiautomatic test fixture 122 that holds a memory module under test and is capable of locking the memory module in a fixed position during testing. If a manual test fixture is used, an operator inserts a memory module into the test fixture, closes the fixture around the module, and locks the module in a proper position. A semiautomatic test fixture requires an operator to insert a module, but it closes around the module and locks the module automatically without an operator intervention. The test fixture 122 may be actuated pneumatically using an external air supply.

Pogo pins are mounted in the test fixture 122 to allow the tester 106 to access simultaneously all contacts of the memory module under test. The tester access is provided through the GPIB interface of the test fixture controller 102.

Each test heads 104 is equipped with a control box 124 and a display box 126. The control box 124 may be a National Electronics Manufacturers Association (NEMA) switch box having a piezo horn for sound signalling, a select switch for selecting a desired operating mode, and two lighted push button switches. The select switch used to set a mode of operation allows a test start command to be provided either manually or automatically depending on whether a manual or semiautomatic test fixture 122 is used. The push button switch equipped with a green lamp is provided for manual test start. Another push button switch equipped with a red lamp is used for acknowledgement that a module under test is failed.

The display box 126 has an alpha-numeric display serially connected to the test fixture controller 102 for displaying operating information. The text on the display may represent a system status, error messages, and indicate actions required from an operator. Also, the display box 126 is equipped with a piezo horn for sound signalling, and with several additional switches for switching between on- and off-line conditions, and acknowledging various system events.

The test fixture controller 102 comprises an embedded single board computer (SBC) 130, for example a V20 PC-XT compatible computer that runs DOS 3.2. The SBC 130 is equipped with a digital input/output (I/O) interface 132 that provides connections with the test heads 104, and with the GPIB interface 110 for communication with the tester 106. Both of these interface functions are transparent to an operator. The system software is written in C and is compiled using the Borland C Compiler Version 3.0. The SBC 130 is provided with a multitasking library comprising test fixture control programs that allow various system events to be handled in real time.

Figure 3:
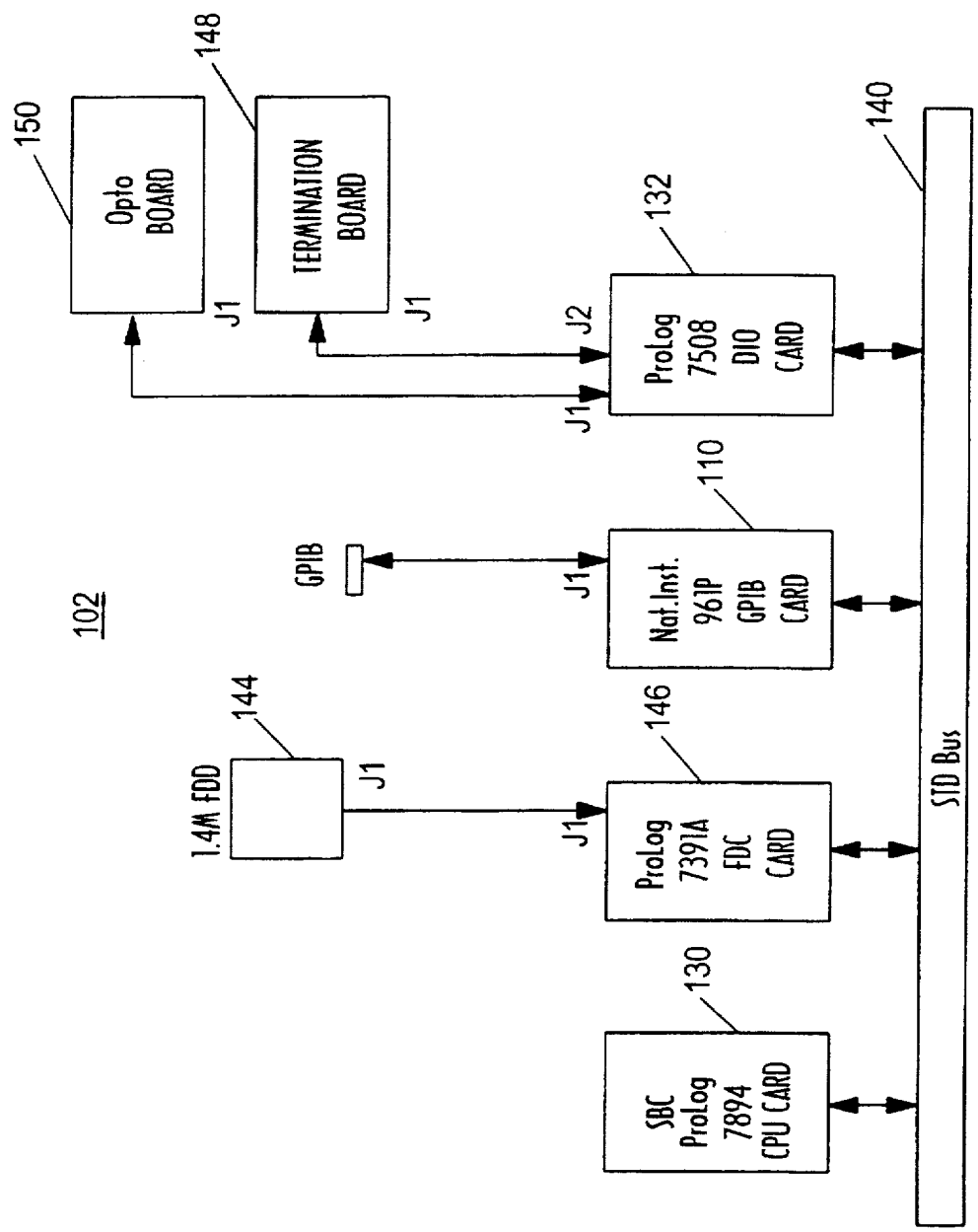
FIG. 3 is a diagram of a test fixture controller bus.

Referring to FIG. 3, the test fixture controller 102 incorporates a standard (STD) bus 140 that enables the SBC 130, for example implemented on a ProLog 7894 CPU card, to communicate with devices coupled to the test fixture controller 102. A 1.4 Mbit floppy-disk drive (FDD) 144 that loads the multitasking library is coupled to the STD bus 140 via an FDD interface 146, such as a ProLog 7391A FDD card. The STD bus 140 is connected to the GPIB card 110, such as 961B GPIB card manufactured by National Instruments, Inc., to interface the SBC 130 with the GPIB between the test fixture controller 102 and the tester 106. The digital I/O interface 132, for example a ProLog 7508 interface card, enables the STD bus 140 to communicate with the test fixture 122 and the control box 124 of each test head 104 via a termination board 148, and with each display box 126 via an optoboard 150.

Figure 4:
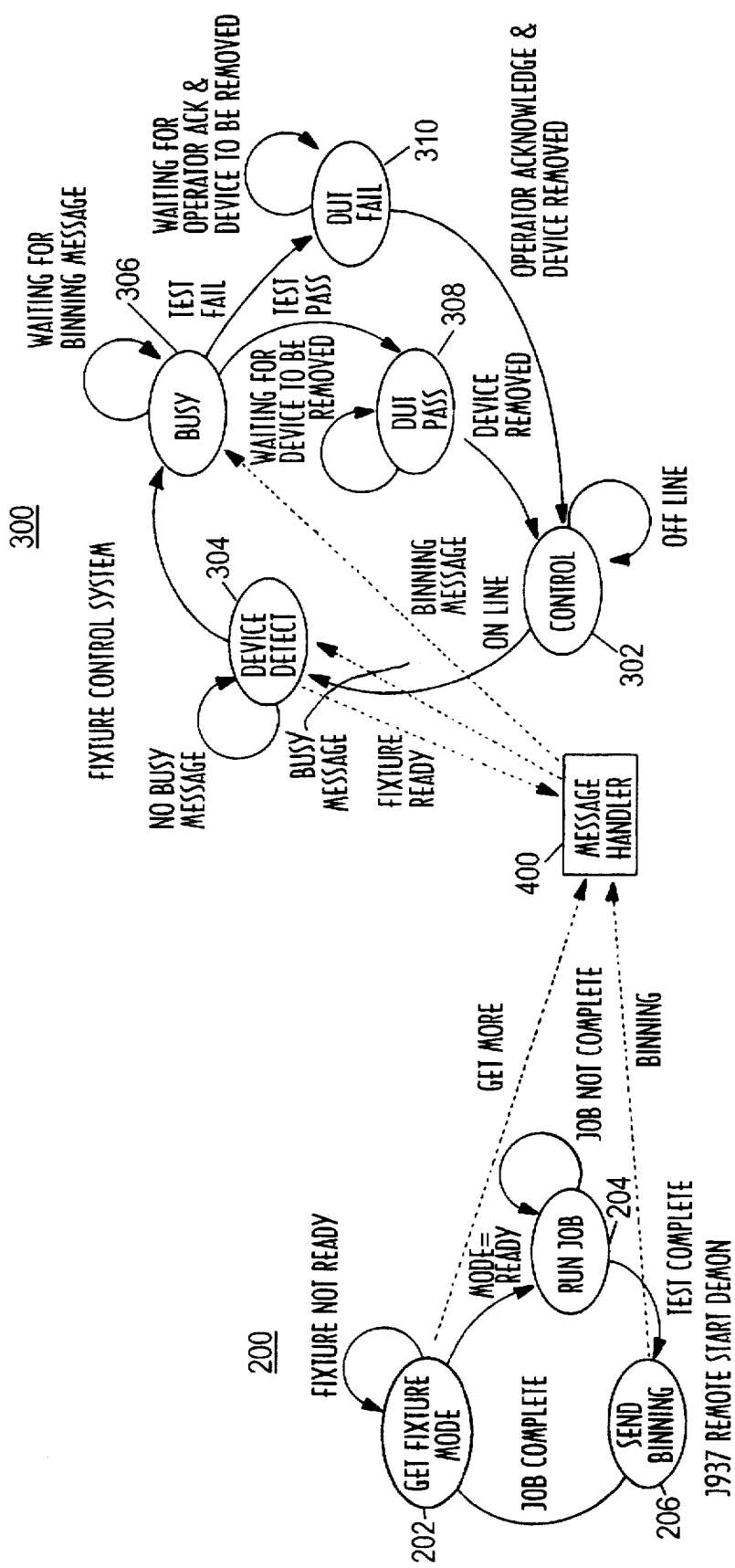
FIG. 4 is a state diagram illustrating interaction between a test fixture control routine and a tester routine.

Since the text fixture controller 102 is a state machine that changes its states in response to test events, its operation will be described using a state diagram in FIG. 4 that shows interaction between a Remote Start Demon test routine 200 run by the J937 tester 106 and a test fixture control routine 300 run by the test fixture controller 102. A message handler 400 provides the translation of the messages from the tester 106 into a format suitable for the test fixture controller 102, and converts messages from the test fixture controller 102 into the format of the tester 106. The message handler 400 may be a program written in C and run by the SBC 130. A message exchange between the tester 106 and the test fixture controller 102 is supported by a GPIB interface routine run by the SBC 130 and composed of high-level GPIB commands written in C.

Initially, the tester 104 is set in a get fixture mode state 202, and the test fixture controller 102 is set in a control state 302. In the get fixture mode state 202, the tester 106 sends a get mode signal to the test fixture controller 102 via the message handler 400 to monitor the status of the test fixture controller 102. At this time, the test fixture controller 102 monitors each of the test heads 104 to determine whether the test head 104 is on-line or off-line. If the test head 104 is off-line, the controller 102 waits until it goes on-line. When the test fixture controller 102 detects that the test head 104 is on-line, it moves into a device detect state 304.

The test fixture 122 is equipped with a fiber optic sensor that detects when a module is inserted into the fixture. In the device detect state 304, the test fixture controller 102 monitors this sensor. If no module is inserted, the controller 102 waits until the sensor detects the module under test. When the module is detected, the test fixture controller 102 monitors a closure switch in the test fixture 122 to check whether the test fixture 122 is properly closed around the module. Semiautomatic test fixtures are closed around the module automatically without operator intervention. Manual test fixtures require operator to close them.

If the select switch on the control box 124 is set into an auto mode position that allows a test to start automatically, the test fixture controller 102 automatically produces a fixture ready signal when the test fixture 122 is properly closed. The fixture ready signal is supplied via the message handler 400 to the tester 106.

If the select switch on the control box 124 is in a manual mode position that requires an operator to start a test manually, the test fixture controller 102 supplies the fixture ready signal when the operator presses the test start button on the control box 124. The fixture ready signal informs the tester 106 that the test fixture controller 102 and the test fixture 122 are ready for a test.

The fixture ready signal causes the transition of the tester 106 from the get fixture mode state 202 to a run job state 204, wherein the tester 106 carries out the pre-programmed tests on the module installed in the test fixture 122. The tester 106 communicates with the test fixture 122 via the STD bus 140 in the test fixture controller 102. Once the tester 106 has started the test procedure, it sends a busy message to the test fixture controller 102. In response to this message, the test fixture controller 102 moves to a busy state 306.

When the test is complete, the tester 106 goes into a send binning state 206 to produce a binning message that indicates whether the module under test passes or fails the test. Through the message handler 400, the binning message is supplied to the test fixture controller 102. If the module passes the test, the controller 102 transmits a test pass signal to the text fixture 122, and goes to a device under test (DUT) pass state 308. If the module fails, the controller 102 transmits a test fail signal to the text fixture 122, and moves to a DUT fail state 310.

In the DUT pass state 308, the test fixture controller 102 automatically releases the passed module from the test fixture 122, and switches on the green lamp in the control box 124 to inform an operator that the module passes the test.

In the DUT fail state 310, the controller 102 keeps the test fixture 122 closed to lock in the failed module. The red lamp in the control box 124 is switched on to inform the operator that the module fails the test. The failed module remains locked in the test fixture 122 until an operator presses the fail acknowledgement button on the control box 124 to acknowledge that the module under test fails. In response to the fail acknowledgement, the test fixture controller 102 releases the module from the test fixture 122. Thus, the test fixture controller 102 prevents mixing passed and failed modules released from the test fixtures 122.

After sending the binning message, the tester 106 returns to the get fixture mode state 202 to wait for the next fixture ready signal from the test fixture controller 102. The test fixture controller 102 returns to the control state 302 to wait until any one of the test heads 104 goes on-line. Then, the above-discussed procedure repeats. If more than one test head 104 are on-line simultaneously, the text fixture control sequence is independently carried out for each of the test heads 104. Moreover, if during the text fixture control procedure, one of the test heads 122 goes off-line, and another remains on-line, the procedure can continues for the remaining test head.

There accordingly has been described an automated test control system that enables an operator to separate modules that pass a test from modules that fail. When a module under test is properly loaded in a test fixture, a test fixture controller instructs a tester to start a test procedure. For a semiautomatic test fixture, a test start command is automatically supplied to the tester when the test fixture is properly closed around the module under test. The test fixture controller automatically interprets the test results provided by the tester. The module that passes the test is automatically released from the test fixture. If the module fails, the test fixture controller keeps it locked in the test fixture. The module is released only when an operator presses a failure acknowledgement button on a control box.

Accordingly, the control system of the present invention enables an operator to separate modules that pass a test from modules that fail to prevent their mixing. The amount of time that the operator requires to make a decision as to how to bin modules is substantially reduced.

Further, the system reduces the time required for testing a module inserted in a semiautomatic test fixture, because a test start command is provided automatically when the test fixture is closed around the module.

In this disclosure, there are shown and described only the preferred embodiments of the invention, but it is to be understood that the invention is capable of changes and modifications within the scope of the inventive concept as expressed herein.

We claim:

1. A system for testing electronic modules comprising:

at least one test fixture for receiving a module to be tested, a tester for carrying out a prescribed test on the module, and a test fixture controller responsive to said test fixture and said tester for causing said test fixture to automatically release from said test fixture a module that passes the test, and to lock in said test fixture a module that fails the test.

2. The system of claim 1, wherein said test fixture controller locks a module that fails the test in said text fixture until an operator acknowledges a failure.

3. The system of claim 2, further comprising a control box having a switch for acknowledging the failure.

4. The system of claim 2, wherein said control box has a mode select switch for switching between a manual and automatic mode of operation.

5. The system of claim 1, wherein said test fixture controller automatically supplies said tester with a test start command to start said prescribed test in an automatic mode of operation, when the module is properly loaded into said test fixture.

6. The system of claim 1, wherein said test fixture controller communicates with said tester via a general purpose interface bus (GPIB).

7. The system of claim 1, further comprising a message handler for converting messages supplied from said tester into a format suitable for said test fixture controller, and for converting messages supplied from said test fixture controller into a format suitable for said tester.

8. The system of claim 1, wherein said test fixture controller comprises a single board computer.

9. The system of claim 1, wherein said test fixture controller monitors said test fixture to determine when said test fixture is set on-line.

10. The system of claim 9, wherein said test fixture controller further monitors said test fixture to detect the module under test.

11. The system of claim 10, wherein said test fixture controller further monitors said test fixture to determine that said test fixture is properly closed around the module.

12. The system of claim 11, wherein said test fixture controller automatically supplies said tester with a ready signal to start testing the module in an automatic mode, when said test fixture is properly closed around the module.

13. The system of claim 11, wherein said test fixture controller supplies said tester with a ready signal to start testing the module in a manual mode, when an operator gives a test start command.

14. The system of claim 11, wherein said tester monitors said test fixture controller to detect a ready signal that instructs said tester to start said prescribed test.

15. The system of claim 14, wherein said test fixture controller monitors said tester to detect a binning signal supplied to said test fixture to indicate whether the module passes or fails the test.

16. The system of claim 15, wherein said test fixture controller automatically opens said test fixture to release the module, when said binning signal indicates that the module passes the test.

17. The system of claim 16, wherein said test fixture controller keeps said test fixture closed, when said binning signal indicates that the module fails the test.

18. The system of claim 17, further comprising an indicator provided at an operator interface to indicate that the module fails the test.

19. The system of claim 18, wherein said test fixture controller causes the text fixture to release the module from the test fixture when an operator acknowledges that the module fails the test.

20. The system of claim 1, wherein the test fixture holds a memory module.

21. The system of claim 1, wherein said test fixture controller controls a plurality of test fixtures independently.

22. The system of claim 21, wherein said test fixture controller continues to control a first test fixture, when a second test fixture is set off-line.

23. A system for controlling at least one test fixture for holding a module under test, comprising:

a central computer responsive to a test result for causing said test fixture to automatically release the module from the test fixture, if the module passes a test, and to lock the module in the test fixture if the module fails the test, and an operator interface for indicating to an operator whether the module passes or fails the test, and for supplying said central computer with a fail acknowledgement signal to release the module that fails the test from the test fixture.

24. A method for controlling at least one test fixture comprising the steps of:

locking an electronic module in the test fixture to test the module, determining whether the module passes or fails a test, automatically releasing the module from the test fixture if the module passes the test, and keeping the module locked in the test fixture if the module fails the test.

25. The method of claim 24, wherein the module that fails the test is kept locked in the test fixture until an operator acknowledges that the module fails.

26. The method of claim 24, further comprising a step of supplying a test start command automatically when the module is locked in the test fixture.

27. The method of claim 24, further comprising a step of monitoring the test fixture to determine whether the test fixture is on-line.

28. The method of claim 27, further comprising a step of monitoring the test fixture to detect the module in the test fixture.

29. The method of claim 28, further comprising a step of monitoring the test fixture to determine whether the test fixture is closed around the module.

30. The method of claim 29, wherein the module is tested by a tester, and the test fixture is monitored by a controller.

31. The method of claim 30, wherein the tester monitors the controller to start testing the module when the controller supplies a test start command.

32. The method of claim 31, wherein the controller automatically release the module from the test fixture when the tester indicates that the module passes a test.

33. The method of claim 32, wherein the controller keeps the test fixture closed when the tester indicates that the module fails the test.

34. The method of claim 33, further comprising a step of providing indication to an operator that the module fails the test.

35. The method of claim 34, further comprising a step of releasing the module from the test fixture when the operator acknowledges that the module fails the test.

36. The method of claim 24, wherein a plurality of modules are controlled independently.

* * * * *